(12) United States Patent
Lahowetz

(10) Patent No.: US 10,094,858 B1
(45) Date of Patent: Oct. 9, 2018

(54) ELECTRICAL TEST ASSEMBLY SHIELDING USER FROM ENERGIZED EQUIPMENT

(71) Applicant: Christopher James Lahowetz, Baytown, TX (US)

(72) Inventor: Christopher James Lahowetz, Baytown, TX (US)

(*) Notice: Subject to any disclaimer, the term of this patent is extended or adjusted under 35 U.S.C. 154(b) by 32 days.

(21) Appl. No.: 15/196,377

(22) Filed: Jun. 29, 2016

(51) Int. Cl.
*G01R 19/145* (2006.01)
*G01R 19/00* (2006.01)

(52) U.S. Cl.
CPC ....... *G01R 19/145* (2013.01); *G01R 19/0084* (2013.01)

(58) Field of Classification Search
None
See application file for complete search history.

(56) References Cited

U.S. PATENT DOCUMENTS

| | | | | |
|---|---|---|---|---|
| 4,791,376 A | * | 12/1988 | Freedman | G01R 1/06788 324/119 |
| 5,367,250 A | * | 11/1994 | Whisenand | G01R 19/16561 324/133 |
| 6,137,285 A | * | 10/2000 | Walsten | G01R 19/14 324/115 |
| 2007/0069716 A1 | * | 3/2007 | Sleeman | G01R 15/125 324/99 D |
| 2010/0317222 A1 | * | 12/2010 | Tom | H01R 13/652 439/490 |
| 2014/0184260 A1 | * | 7/2014 | Russell | G01R 1/06788 324/755.01 |
| 2015/0002138 A1 | * | 1/2015 | Fox | G01R 15/142 324/149 |
| 2015/0143687 A1 | * | 5/2015 | O'Connell | H01R 13/518 29/592.1 |

* cited by examiner

*Primary Examiner* — Melissa Koval
*Assistant Examiner* — Nasima Monsur
(74) *Attorney, Agent, or Firm* — Plager Schack LLP; Mark H. Plager

(57) ABSTRACT

A test assembly system protects a user from potentially energized equipment. Aspects of the system provide access to the equipment through a socket connection and a test probe assembly that is configured to interface with the socket connection to read voltage or continuity across a bus of the equipment being inspected. The probe assembly shields the user from the equipment to prevent energy or arc flashes from projecting out to contact the user.

4 Claims, 6 Drawing Sheets

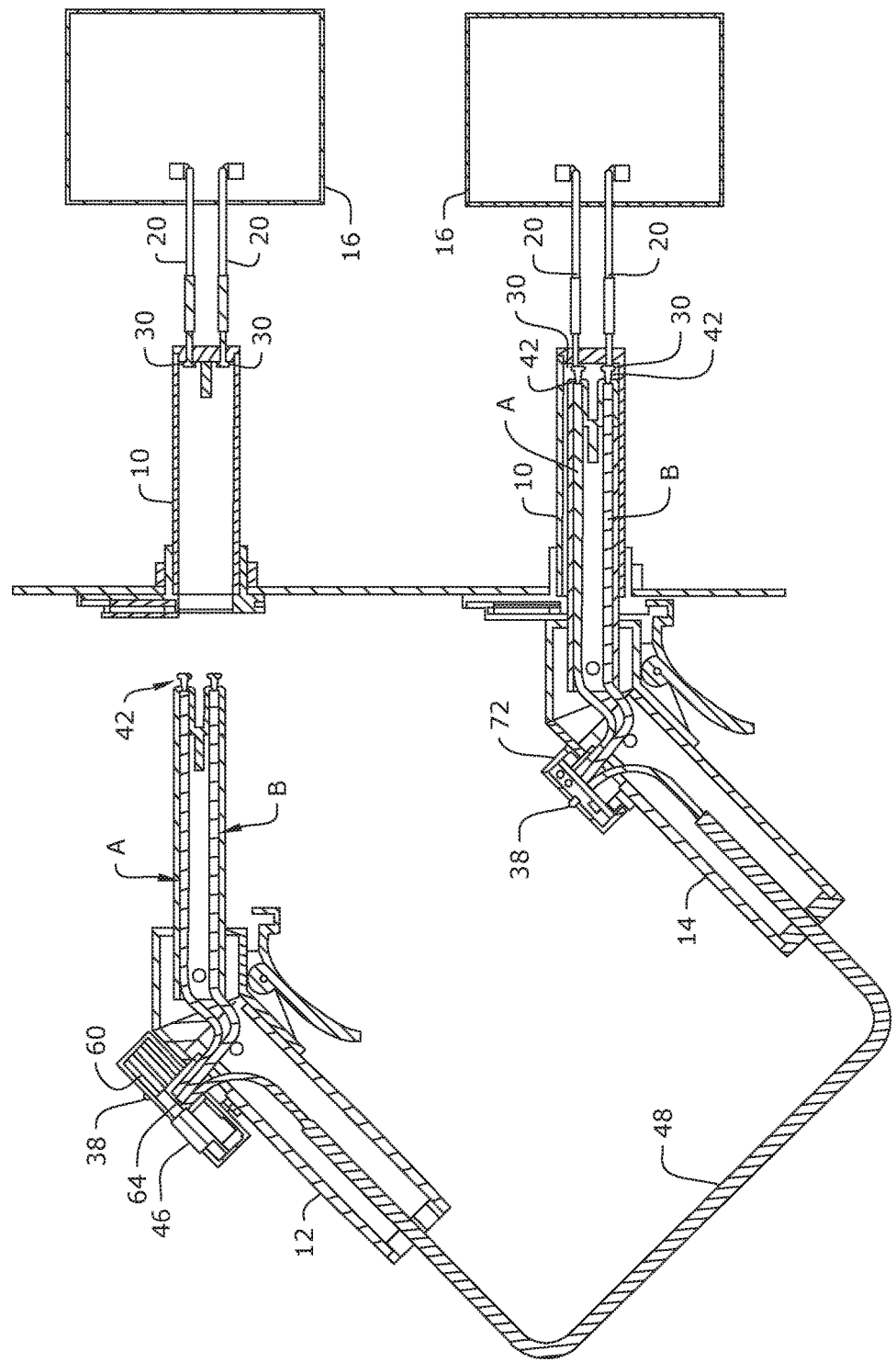

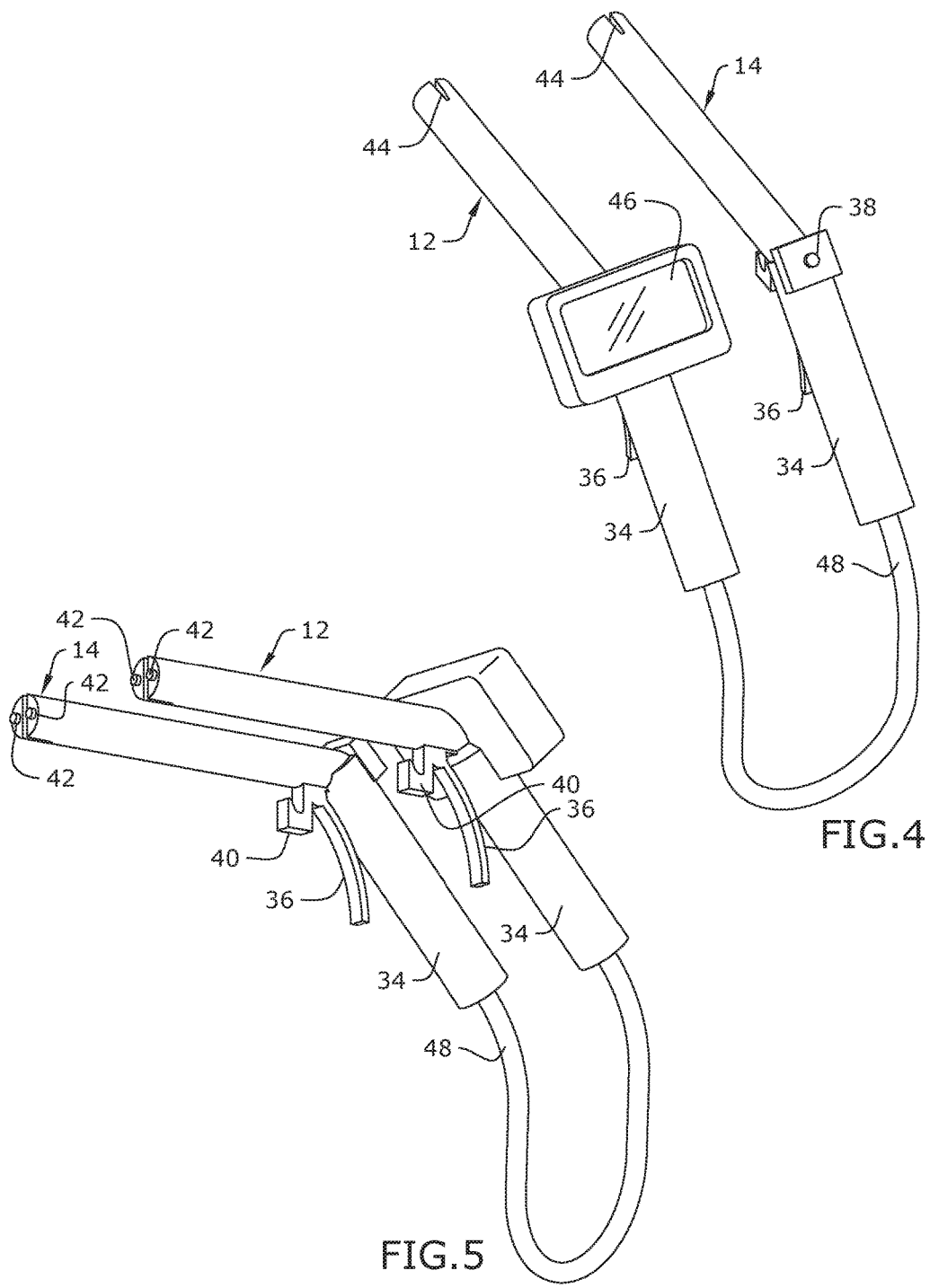

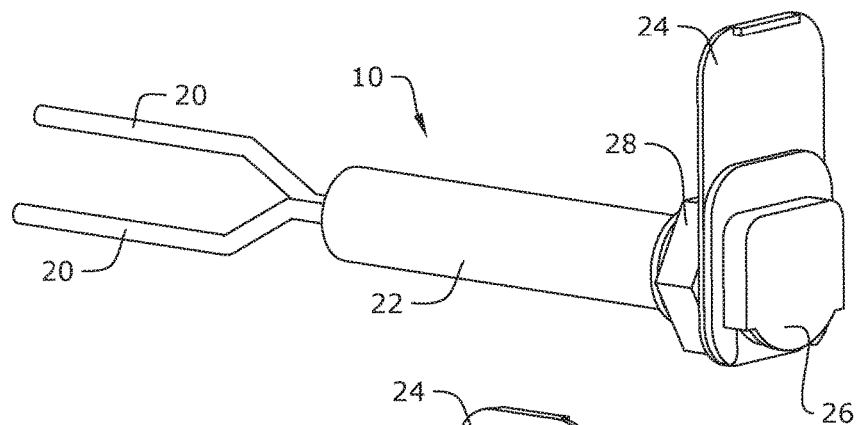
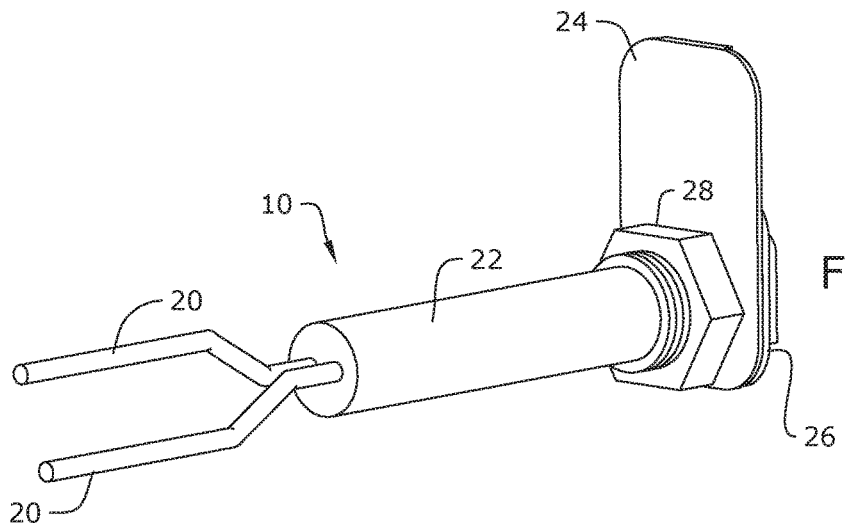
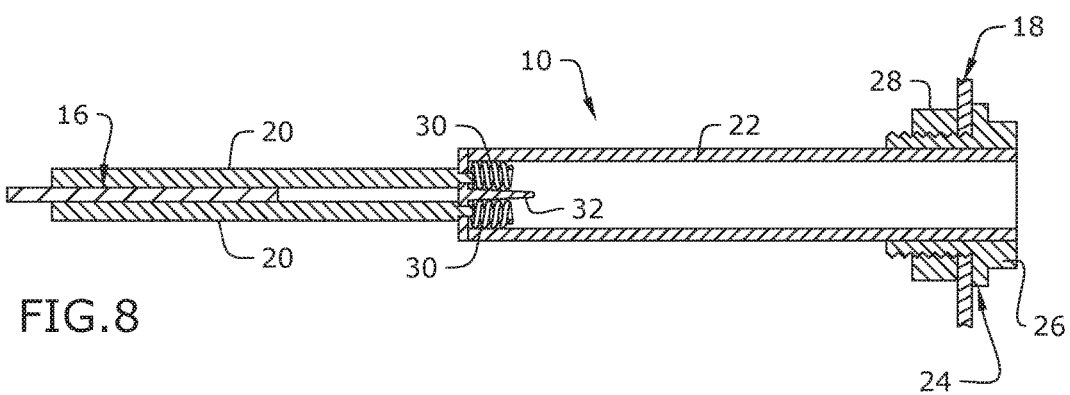

ELECTRICAL TEST ASSEMBLY SHIELDING USER FROM ENERGIZED EQUIPMENT

CROSS-REFERENCE TO RELATED APPLICATIONS

None.

BACKGROUND

The embodiments herein relate generally to testing instruments, and more particularly, to an electrical test assembly shielding the user from energized equipment.

High voltage electrical equipment is typically housed in a cabinet to protect those in the area from exposure to dangerous voltages and to protect the equipment inside from the environment. In some instances, the equipment within the cabinet needs to be inspected either for routine maintenance or to identify a fault in the line the equipment is in connection with. Inspecting energized equipment can be very dangerous. In order to inspect the equipment the cabinet must be opened to gain access to points in the electrical equipment that need to be tested with a voltmeter to provide an indication of existing voltages, working voltages, or if the equipment has been properly powered down. In some instances, if there is a fault within the equipment, there is an energized portion which will conduct with the technician as he or she opens the door and is exposed to the field of energy or an arc flash may occur electrocuting and burning the technician.

In a lower voltage setting, inspection of conventional two prong wall outlets runs a similar risk. An electrician often needs to check whether the outlet is "hot" or dead. In some cases, there is a short present in the outlet. The electrician typically uses a conventional volt meter with hand held probes that are designed for direct contact with the electrical line. If a short is present, a small arc flash may occur easily reaching the electrician's fingers holding the probes electrocuting the electrician.

As can be seen, there is a need for an apparatus and system that protects a user by verifying voltage levels/continuity or to verify the power is completely secured prior to opening the electrical cabinet during inspection of electrical equipment.

SUMMARY

According to one embodiment, an electric measurement test assembly comprises a handle; a pair of conductive contacts integrated into a probe housing attached to the handle, the pair of contacts configured for receipt within a socket integrated into a cabinet housing potentially energized electrical equipment; and a meter connected to the handle, the meter coupled to the pair of conductive contacts and configured to read voltage present in the potentially energized equipment.

According to another embodiment, an electric measurement test assembly system comprises a socket integrated into a cabinet housing potentially energized electrical equipment, the socket including an opening on an exterior of the cabinet; a sleeve coupled to the socket, the sleeve projecting into the interior of the cabinet housing; a conductive element coupled to the sleeve, the conductive element on the exterior of the sleeve and adapted to connect to a bus of the potentially energized electrical equipment; a conductive point in the interior of the sleeve, the conductive point coupled to the conductive element; and a probe assembly, including, a pair of conductive contacts integrated into a probe assembly body, the probe assembly body configured for receipt within the socket through the opening on the exterior of the cabinet, the probe assembly body including a length configured to make contact between the pair of conductive contacts and the conductive point in response to the probe assembly body being received within the socket, and a meter connected to the pair of conductive contacts and configured to read voltage present in the potentially energized equipment via the conductive element.

According to still yet another embodiment, electric measurement test assembly system comprises a pair of sockets integrated into a cabinet housing potentially energized electrical equipment, each of the pair of sockets including an opening on an exterior of the cabinet; a sleeve coupled to each of the pair of sockets, the sleeve projecting into the interior of the cabinet housing; a conductive element coupled to each sleeve, the conductive element on the exterior of each sleeve, each conductive element adapted to connect to a respective bus of the potentially energized electrical equipment; a conductive point in the interior of each sleeve socket, the conductive point coupled to the conductive element; a pair of probe assemblies, each probe assembly including, a pair of conductive contacts integrated into a respective probe assembly body, the probe assembly body of respective probe assemblies configured for receipt within a respective one of the pair of sockets through respective openings on the exterior of the cabinet, each probe assembly body including a length configured to make contact between the respective pair of conductive contacts and the respective conductive point of respective sleeves in response to respective probe assembly bodies being received within respective sockets of the pair of sockets, and a wire connecting the pair of conductive contacts of respective probe assemblies to each other; and a meter connected to the pair of conductive contacts of one of the pair of probe assemblies and configured to read voltage present in the potentially energized equipment via the conductive element of respective sleeves.

BRIEF DESCRIPTION OF THE FIGURES

The detailed description of some embodiments of the present invention is made below with reference to the accompanying figures, wherein like numerals represent corresponding parts of the figures.

FIG. 3B is a cross-sectional side view of the system with detailed internal wiring connections shown according to an exemplary embodiment;

FIG. 4 is a perspective top view of an electric measurement test assembly in accordance with an exemplary embodiment of the subject technology;

FIG. 5 is a side perspective view of the assembly of FIG. 4;

FIG. 6 is a front end perspective view of a socket connection removed from the cabinet of FIG. 1;

FIG. 7 is a rear end perspective view of the socket connection of FIG. 6;

FIG. 8 is a cross-sectional view taken along the line 8-8 of FIG. 1;

DETAILED DESCRIPTION OF CERTAIN EMBODIMENTS

Figure 1:
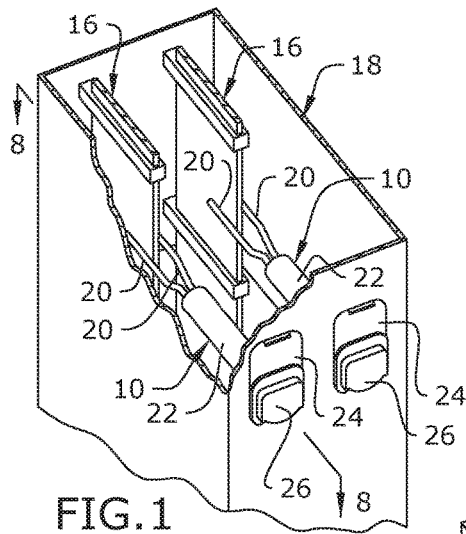
FIG. 1 is a perspective broken view of a cabinet housing potentially energized electrical equipment and a socket connection portion in accordance with an exemplary embodiment of the subject technology.
Figure 2:
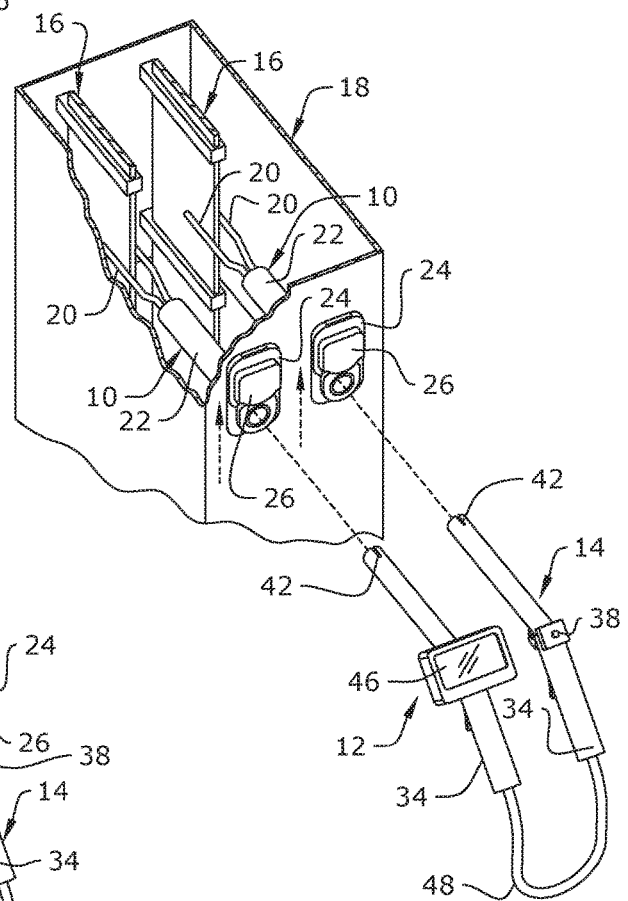
FIG. 2 is a perspective, exploded view of an electric measurement test assembly system in accordance with an exemplary embodiment of the subject technology.

The word "exemplary" is used herein to mean "serving as an example or illustration." Any aspect or design described herein as "exemplary" is not necessarily to be construed as preferred or advantageous over other aspects or designs.

By way of example, and referring to the Figures, embodiments disclosed generally provide a test assembly system protecting a user from potentially energized equipment. Aspects of the subject technology provide access to the equipment on the interior of for example a cabinet, through a socket connection integrated into the cabinet housing and a test probe assembly that is configured to interface with the socket connection to read voltage across two buss ducts or a buss duct to neutral or ground on the interior of the cabinet. The user, for example a technician or electrician, may safely measure the presence of voltage and continuity without the risk of exposing himself/herself to arc flashes, dangerous voltage or unleashed voltage fields that is sometimes encountered when opening a cabinet door to inspect the equipment inside.

For example, referring to FIGS. 1-2 and 3A-3B, a cabinet housing 18 may include a socket 24 integrated into one of the cabinet walls and accessible from the cabinet housing's exterior. The socket 24 may include a sleeve assembly 10 on the interior of the cabinet 18 and projecting therefrom into the interior. The sleeve assembly 10 may be generally hollow. The details of the interior of the sleeve assembly 10 are described further below. A conductive element 20 may be connected to and project from the sleeve 10 to make contact with a bus 16. The bus 16 is connected to the potentially energized equipment, which is not shown for sake of illustration. In some embodiments, the conductive element 20 may be a pair of pronged wires configured to contact both sides of a panel type bus 16. In some embodiments, the socket 24 may include a cover 26 which may be slidable or hinged to prevent access to the sleeve assembly 10 until there is a need for measurements. A trigger 36 connected to a latch 40 on the probe assemblies 12;14 are configured to secure the assemblies into the sockets 24.

Figure 3A:
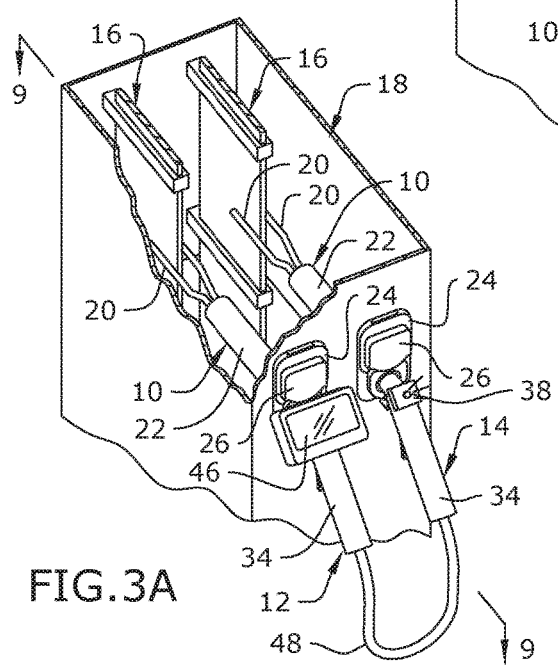
FIG. 3A is a perspective, unexploded view of the electric measurement test assembly system of FIG. 2.
Figure 3C:
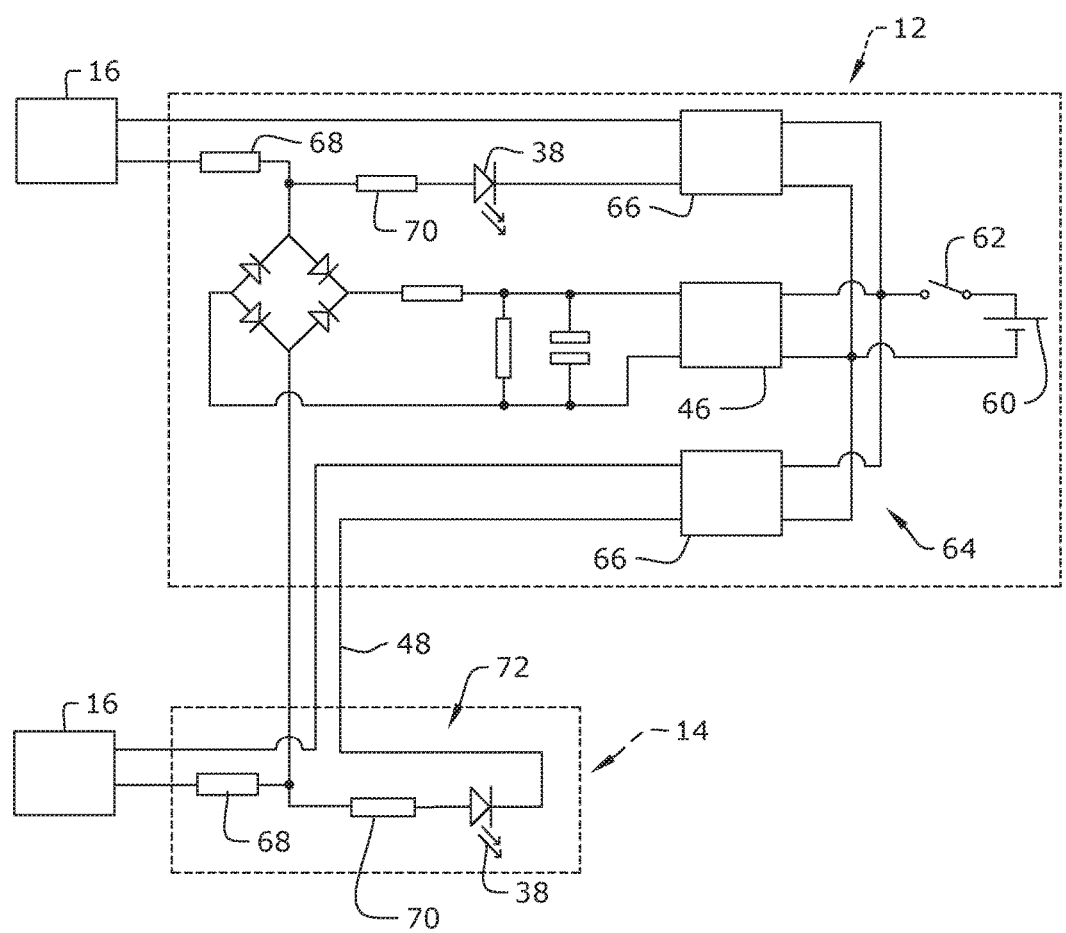
FIG. 3C is an electrical schematic of the system of FIG. 3B according to an exemplary embodiment.

Referring now to FIGS. 2, 3A, 3B, 3C, 4 and 5 in an exemplary embodiment, the system includes an electric measurement test probe assembly system. FIG. 3C represents an electrical schematic of the components in the other figures. As shown, some exemplary embodiments comprise a dual probe assembly system including a first probe assembly 12 and a second probe assembly 14 connected together by a wire 48. As will be appreciated, the dual probe assembly embodiments are especially useful to meet measurement standards under many regulations. In embodiments using a dual probe assembly, there may also be present a dual socket connection configuration using adjacent sockets 24 integrated into the cabinet housing 18. The probe assemblies 12 and 14 may include a handle 34 connected to a probe housing. A pair of conductive contacts 42 are positioned on the end of each probe body to read electrical signals when the probe assemblies 12 and 14 are inserted in respective sockets 24. The contacts 42 in each probe assembly 12;14 are not connected to each other but are each connected (via wiring) to a circuit board 64 at separate locations and used for the process of conducting the continuity test. The bottom connection/wire in each probe 12;14 is also connected to the circuit board 64 in separate locations and is used for measuring the voltage potential between the probes.

The probe housing may include a channel 44 providing isolation between the conductive contacts 42. In some embodiments, the first probe assembly 12 includes a meter 46 in electrical connection with the contacts 42. The meter 46 may be for example a digital display configured to measure voltage and continuity from the contacts 42. The second probe assembly 14 may include a light indicator 38 in electrical connection with its contacts 42. The light indicator 38 may be configured to register whether a proper connection with the bus 16 is made when the probe assembly 14 is in its socket 24.

A separate continuity circuit is in each probe assembly 12;14 (i.e. 2 continuity circuits per assembly). Both circuits receive power from the same battery 60, but operate independently of each other. In the cable 48 there may be three wires: one positive (+), one negative (−), and the third is a voltage signal coming directly from the buss through a current limiting resistor 70. The (+) and (−) wires may be for circuit operating power. The voltage signal from main probe assembly 12 is connected to the main unit circuit board 64 readout on the meter/display 46. A DC/DC isolated voltage converter 66 for each probe assembly 12;14 receives power from the battery 60 as controlled by a switch 62. A fuse 68 may be on each probe line to protect from overcurrent, cuts, or shorts in the wire. Power may continue through a resistive circuit and an LED 38 may illuminate in the presence of a positive connection to the buss bar for respective sleeve assemblies 12;14. Once there is a potential difference between probe assemblies 12;14 (downstream of the fuse 68), the inputs may be rectified and reduced to a level readable by the meter 46. In the event a fuse 68 blows, the LED indicator may not illuminate indicating to the operator there is a disconnect with the buss line.

Figure 9:
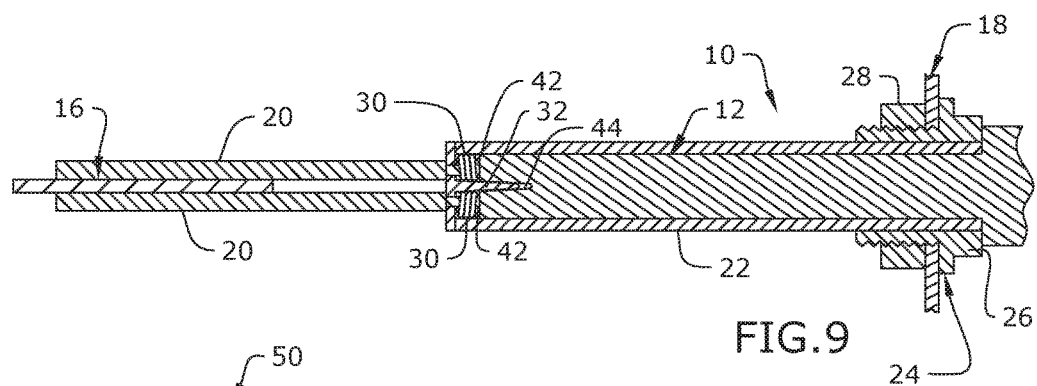
FIG. 9 is a cross-sectional view taken along the line 9-9 of FIG. 3.

Referring now to FIGS. 6-9, details of a socket 24 are shown according to an exemplary embodiment of the subject technology. The sleeve assembly 10 may include a hollow body 22 for receipt of the probe housing. The socket(s) 24 may be secured into the cabinet housing 18 wall by use of a retaining nut 28 locking the sleeve body 22 against the cabinet wall (not shown). The interior of the sleeve body 22 may include a conductive point(s) 30. The probe body may be long enough so that when it is inserted within the sleeve body 22, the contacts 42 make contact with the conductive points 30. A divider guide 32 may be positioned between the conductive points 30 and disposed to receive the channel 44 to guide respective contacts 42 to respective conductive points 30 (FIGS. 8 and 9). Upon contact of the contacts 42 to conductive points 30, an electrical connection is made between the bus 16 through the conductive element(s) 20 through the conductive points 30, the contacts 42 and wiring (not shown) to the meter 46 and/or light indicator (LED) 38. Thus any voltage present in the potentially energized equipment (not shown) may be detected along the bus 16 safely behind the cabinet 18 walls. As will be appreciated, the sleeve assembly 10 and the socket 24 shield the interior of the cabinet 18 from the exterior thus preventing any charge or arc flash from escaping and making contact with the user.

In operation, the system first checks for continuity and if present measures voltage potential difference between probe connections. Generally, the system is checked against a test assembly before application to a panel being measured to ensure proper functionality. When applied to a panel under test, the operator may install the secondary probe assembly 14 into a neutral, ground, or phase point of a socket 24 connected to the panel being measured. For continuity, power from the battery 60 energizes the circuits on both circuit boards (64 in probe assembly 12, 72 in probe assembly 14). A signal is generated by the electronics and applied to wire A (FIG. 3 B). The signal passes through items 42, 30 and 20 to the buss 16. The signal passes through the buss 16, then returns through 20, 30, 42 and wire B. The signal returns to the printed circuit board 72 where it triggers the LED 38 to illuminate indicating positive connection to the buss 16. Once positive continuity for the secondary probe assembly 14 is detected, the operator may install the main probe assembly 12 into the other side socket 24 of the panel being tested. Continuity test signal from the main probe assembly 12 PC Board 64 travels through a wire to the end contacts of the probe assembly 12, then through the terminal springs (conductive point(s) 30) inside the sleeve, to a first of the conductive elements 20 (outlet wire prong connection), through buss 16 and then to the second of the conductive elements 20 on the outside of the probe. The signal then continues back through the second wire inside the probe and back to the PC board 64. If the connections are all made and the PC board circuit continuity, the LED 38 will illuminate. When voltage is present on buss 16 for the probe assembly 12, a voltage potential is present on items 20, 30, 42 wire B. This voltage passes through the current limiting resistor 70 and to the printed circuit board 64. For the secondary probe assembly 14, voltage then passes through the cable 48 to the probe assembly 12 printed circuit board 46. On the probe assembly 12 printed circuit board 64, the voltage input from both probe assemblies 12;14 are compared and the display 64 indicates the voltage potential between the probes.

Figure 10:
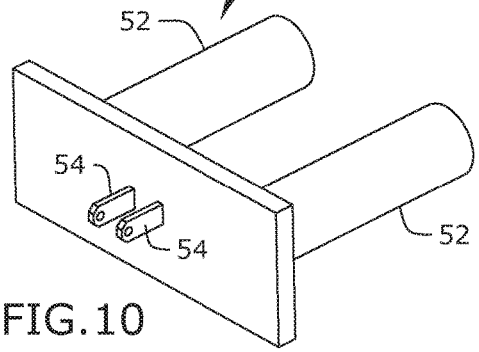
FIG. 10 is a front end perspective view of a socket connection in accordance with an alternate exemplary embodiment of the subject technology.
Figure 11:
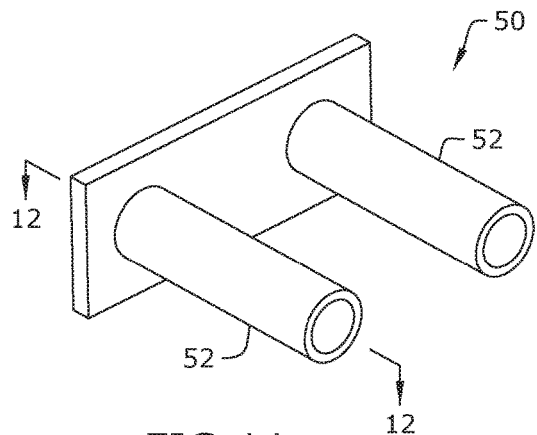
FIG. 11 is a rear end perspective view of the socket connection of FIG. 10.
Figure 12:
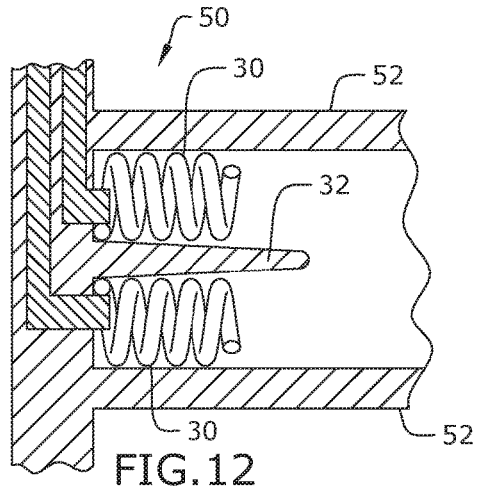
FIG. 12 is a cross-sectional view taken along the line 12-12 of FIG. 11.

Referring now to FIGS. 10-12, a testing assembly 50 for testing proper functionality of the probe assembly of FIG. 1 is shown. The probe assembly should be tested as part of a safety requirement to ensure the probe is working correctly before use and still working after use so the findings/readings can be ensured to be correct. The assembly 50 may include hollow sleeve bodies 52 that project outward. The sleeve bodies 52 include the conductive points 30 and divider guide 32 configured similar to the embodiments described above. Each conductive point 30 may be electrically connected to a trace which in turn is connected to a prong 54. In use, the probe assemblies 12 and 14 (FIG. 1) may be inserted into sleeve bodies 52 to make an electrical connection to check if probe assemblies 12;14 are functioning properly.

Persons of ordinary skill in the art may appreciate that numerous design configurations may be possible to enjoy the functional benefits of the inventive systems. Thus, given the wide variety of configurations and arrangements of embodiments of the present invention the scope of the present invention is reflected by the breadth of the claims below rather than narrowed by the embodiments described above.

What is claimed is:

1. An electric measurement test assembly system, comprising:
   a first socket and a second socket integrated into a cabinet of high voltage equipment, housing potentially energized electrical equipment, each socket including an opening on an exterior of the cabinet;
   first and second busses projecting from respective elements of the potentially energized equipment in the cabinet of high voltage equipment;
   a first sleeve coupled to the first socket and a second sleeve coupled to the second socket, both the first and second sleeves projecting into the interior of the cabinet of high voltage equipment;
   a first conductive element coupled to the first sleeve and a second conductive element coupled to the second sleeve, wherein both the first and second conductive elements are on the exterior of their respective sleeve and adapted to connect respectively to the first and second busses of the potentially energized electrical equipment;
   a first conductive point in the interior of the first sleeve, the first conductive point coupled to the first conductive element;
   a second conductive point in the interior of the second sleeve, the second conductive point coupled to the second conductive element; and
   a first probe assembly and a second probe assembly, each respective probe assembly, including,
      a pair of conductive contacts integrated into a respective probe assembly body,
      wherein, the first probe assembly body is configured for receipt within the first socket of the cabinet,
      the second probe assembly body is configured for receipt within the second socket of the cabinet,
      the first probe assembly body includes a length configured to make contact between the pair of conductive contacts and the first conductive point in response to the first probe assembly body being received within the first socket,
      the second probe assembly body includes a length configured to make contact between the pair of conductive contacts and the second conductive point in response to the second probe assembly body being received within the second socket, and
      a meter connected to the pair of conductive contacts and configured to read voltage present in the potentially energized equipment via the conductive element.

2. The electric measurement test assembly system of claim 1, wherein the first conductive element and the second conductive element comprises a pair of wire probes configured to make contact on two sides of the bus.

3. The electric measurement test assembly system of claim 1, wherein the conductive contact points include at least one spring contact for movable receipt of at least one of the pair of conductive contacts.

4. The electric measurement test assembly system of claim 3, further comprising a divider guide between a pair of the at least one spring contact, the divider guide positioned to guide the pair of conductive contacts to a respective one of the pair of the at least one spring contacts.

* * * * *